(12) United States Patent
Barwicz

(10) Patent No.: US 8,415,220 B2
(45) Date of Patent: Apr. 9, 2013

(54) CONSTRAINED OXIDATION OF SUSPENDED MICRO- AND NANO-STRUCTURES

(75) Inventor: Tymon Barwicz, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 12/709,981

(22) Filed: Feb. 22, 2010

(65) Prior Publication Data

US 2011/0207335 A1 Aug. 25, 2011

(51) Int. Cl.
*H01L 21/336* (2006.01)

(52) U.S. Cl.
USPC .... 438/300; 257/347; 257/401; 257/E21.415; 438/197

(58) Field of Classification Search ................ 977/762; 257/E21.415, 347, 401; 438/197, 300
See application file for complete search history.

(56) References Cited

U.S. PATENT DOCUMENTS

| | | | |
|---|---|---|---|
| 6,265,026 B1 | 7/2001 | Wang | |
| 6,773,950 B2 * | 8/2004 | Tanenbaum et al. | 438/50 |
| 6,830,950 B2 | 12/2004 | Chinn et al. | |
| 7,109,072 B2 * | 9/2006 | Saito et al. | 438/149 |
| 7,357,877 B2 | 4/2008 | Van Den Meerakker et al. | |
| 7,438,759 B2 * | 10/2008 | Zhang et al. | 117/4 |
| 2005/0253138 A1 | 11/2005 | Choi et al. | |
| 2008/0061284 A1 * | 3/2008 | Chu et al. | 257/9 |
| 2008/0135998 A1 | 6/2008 | Witvrouw et al. | |
| 2008/0142853 A1 | 6/2008 | Orlowski | 257/287 |
| 2008/0206122 A1 * | 8/2008 | Keller | 423/335 |
| 2008/0246021 A1 * | 10/2008 | Suk et al. | 257/24 |
| 2008/0254627 A1 * | 10/2008 | Wells | 438/689 |
| 2010/0089451 A1 * | 4/2010 | Harimoto et al. | 136/261 |
| 2010/0295020 A1 * | 11/2010 | Barwicz et al. | 257/24 |

FOREIGN PATENT DOCUMENTS

| | | |
|---|---|---|
| CN | 1669920 A | 9/2005 |
| WO | WO0121863 A1 | 3/2001 |

* cited by examiner

*Primary Examiner* — John C Ingham
(74) *Attorney, Agent, or Firm* — Vazken Alexanian; Michael J. Chang, LLC

(57) ABSTRACT

Techniques for preventing bending/buckling of suspended micro/nanostructures during oxidation are provided. In one aspect, a method for oxidizing a structure is provided. The method includes providing the structure having at least one suspended element selected from the group consisting of: a microstructure, a nanostructure and a combination thereof; surrounding the at least one suspended element in a cladding material; and oxidizing the at least one suspended element through the cladding material, wherein the cladding material physically constrains and thereby prevents distortion of the at least one suspended element during the oxidation.

16 Claims, 9 Drawing Sheets

800

CONSTRAINED OXIDATION OF SUSPENDED MICRO- AND NANO-STRUCTURES

FIELD OF THE INVENTION

The present invention relates to oxidation of suspended micro/nanostructures, and more particularly, to techniques for preventing geometrical abnormalities from occurring in suspended micro/nanostructures during oxidation.

BACKGROUND OF THE INVENTION

Suspended micro- and nano-structures are of increasing technological importance. In many circumstances, oxidation of a suspended structure may be necessary. For instance, this is the case in the fabrication of nanowire-based transistors where the nanowire often needs to be thinned when suspended or a gate oxide may have to be defined. The oxidation of suspended structures can however result in undesirable bending or buckling of the structures.

Therefore, techniques that minimize or eliminate the bending/buckling of suspended micro/nanostructures during oxidation would be desirable.

SUMMARY OF THE INVENTION

The present invention provides techniques for preventing bending/buckling of suspended micro/nanostructures during oxidation. In one aspect of the invention, a method for oxidizing a structure is provided. The method includes providing the structure having at least one suspended element selected from the group consisting of: a microstructure, a nanostructure and a combination thereof; surrounding the at least one suspended element in a cladding material; and oxidizing the at least one suspended element through the cladding material, wherein the cladding material physically constrains and thereby prevents distortion of the at least one suspended element during the oxidation.

A more complete understanding of the present invention, as well as further features and advantages of the present invention, will be obtained by reference to the following detailed description and drawings.

DETAILED DESCRIPTION OF PREFERRED EMBODIMENTS

Figure 1:
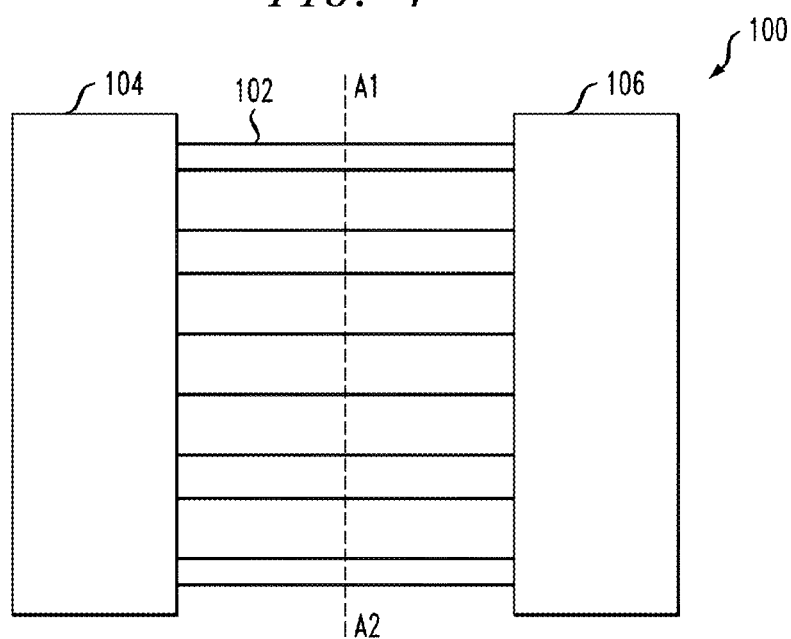
FIG. 1 is top-down diagram illustrating an exemplary structure having a plurality of micro/nanostructures and pads attached at opposite ends thereof forming a ladder-like structure according to an embodiment of the present invention.

Provided herein are techniques for preventing distortion, i.e., geometrical abnormalities, from occurring during oxidation of suspended micro/nanostructures. As will be described in detail below, the suspended structure is constrained at oxidation to prohibit it from developing a notable amplification of stress non-uniformities and the corresponding geometrical abnormalities. FIGS. 1-6 are diagrams illustrating an exemplary methodology for oxidizing a structure having one or more suspended elements (e.g., one or more suspended microstructures and/or nanostructures). FIG. 1 is a top-down diagram illustrating exemplary structure 100 having a plurality of microstructures and/or nanostructures 102 and pads 104 and 106 attached at opposite ends thereof forming a ladder-like structure. Structure 100 can be fabricated using conventional top-down or bottom-up fabrication techniques. Such techniques are known to those of skill in the art and thus are not described further herein. In one exemplary embodiment, structure 100 is formed in a silicon-on-insulator (SOI) layer of a SOI wafer. Further, according to the exemplary embodiment shown in FIG. 1, micro/nanostructures 102 are in the form of microwires and/or nanowires, respectively.

Figure 2:
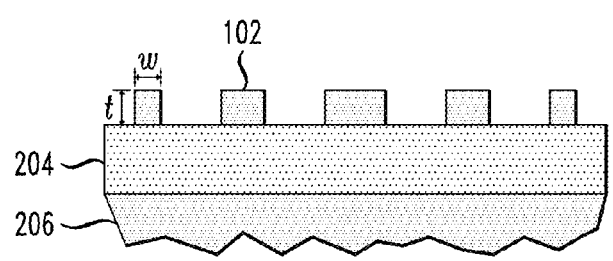
FIG. 2 is a diagram illustrating a cross-sectional cut through the structure of FIG. 1 according to an embodiment of the present invention.

FIG. 2 is a diagram illustrating a cross-sectional cut through the structure of FIG. 1. Specifically, what is shown in FIG. 2 is a cross-sectional cut through line A1-A2 of FIG. 1. As shown in FIG. 2, the SOI wafer includes a SOI layer, in which micro/nanostructures 102 and pads 104 and 106 (though not visible in this depiction) are formed, separated from a substrate 206 by a buried oxide (BOX) 204.

In general, when the structures 102 formed have a width w of from about one micrometer ($\mu$m) to about 100 $\mu$m and a thickness t of from about 0.1 $\mu$m to about 20 $\mu$m they are referred to herein as microstructures, and when the structures 102 formed have a width w of from about one nanometer (nm) to about 1,000 nm and a thickness t of from about 0.1 nm to about 100 nm they are referred to herein as nano structures.

As shown in FIG. 2, variations in the width w and thickness t dimensions in each micro/nanostructure 102 are likely to occur. Specifically, in most instances the width w does not equal the thickness t. Such asymmetry, while a normal result of the lithography and etching processes, can be disadvantageous as it impacts the achievable dimensions and shape control in oxidation thinning. This variation is addressed below, and can be "corrected for" using a symmetrization procedure.

Figure 3:
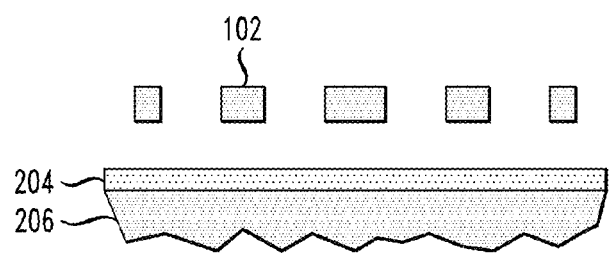
FIG. 3 is a cross-sectional diagram illustrating the micro/nanostructures of FIGS. 1 and 2 having been suspended according to an embodiment of the present invention.

The micro/nanostructures 102 are then suspended. See, for example, FIG. 3. FIG. 3 is a cross-sectional diagram illustrating micro/nanostructures 102 having been released by undercutting BOX 204, i.e., by removing BOX 204 from under a portion thereof. BOX 204 can be isotropically etched using, e.g., hydrofluoric acid in liquid or vapor form, to fully undercut the BOX beneath the micro/nanostructures. The undercutting releases micro/nanostructures 102 from BOX 204. Pads 104 and 106 (see FIG. 1), however, remain attached (anchored) to BOX 204. Thus, micro/nanostructures 102 are suspended over the undercut BOX 204.

In many applications it is desirable to next oxidize the micro/nanostructures. By way of example only, if micro/nanostructures 102 are to serve as channels of a transistor, it may be desirable to oxidize the channels to produce a dielectric around which a gate is placed. It may also be desirable to thin the channels using self-limiting oxidation. See, for example, U.S. application Ser. No. 12/417,936 filed by Barwicz et al., entitled "Top-Down Nanowire Thinning Processes" (hereinafter "U.S. application Ser. No. 12/417,936"), the contents of which are incorporated by reference herein. If the suspended micro/nanostructures 102 were then simply oxidized, and if there is prior to oxidation or develops at oxidation a slight curvature in the sample and/or a slight imbalance in the oxide thickness (both common occurrences) undesirable bending or buckling of micro/nanostructures 102 would likely be the result. As will be described in detail below, it has been found by way of the present teachings that this bending or buckling is due, at least in part, to various stresses at the silicon (Si)-to-oxide interfaces of the structures which influence the speed of growth of the oxide. As a result, oxidation will occur at different speeds on different portions of the micro/nanostructures, undesirably amplifying any non-uniformities, such as curvature, in the structures.

Figure 4:
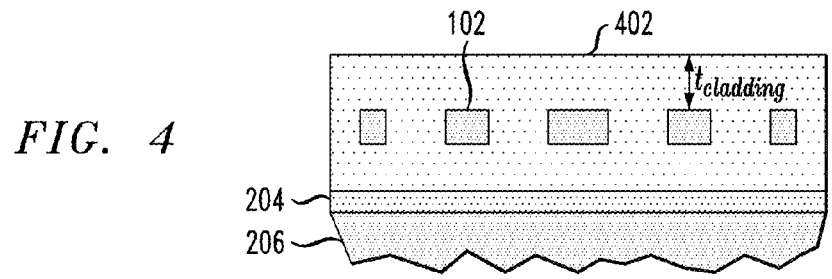
FIG. 4 is a cross-sectional diagram illustrating the micro/nanostructures of FIG. 3 having been surrounded in a cladding material according to an embodiment of the present invention.

Advantageously, the present teachings provide a way to minimize or eliminate this unwanted distortion, e.g., bending/buckling, during oxidation. Specifically, as provided herein, the suspended micro/nanostructure(s) are physically constrained during oxidation to prevent the structures from developing a notable amplification of stress non-uniformities and thereby to prevent the structures from bending or buckling. For example, according to one exemplary embodiment, a cladding material is used to constrain the micro/nanostructure (s), see for example FIG. 4. FIG. 4 is a cross-sectional diagram illustrating micro/nano structures 102 having been surrounded in a cladding material 402. Cladding material 402 will physically restrain micro/nanostructures 102 preventing the structures from bending or buckling. According to an exemplary embodiment, cladding material 402 has a thickness $t_{cladding}$ (measured as a thickness of the cladding material above micro/nanostructures 102, see FIG. 4) of greater than about 100 nm. As will be described, for example, in conjunction with the description of FIG. 15, below, employing cladding material of a sufficient thickness (e.g., $t_{cladding}$ of greater than about 100 nm) can minimize an impact, if any, the cladding material thickness has on the oxidation process.

Since cladding material 402 will remain in place during the oxidation (i.e., the micro/nanostructures are oxidized through the cladding material), the cladding needs to be permeable to at least one oxidant (such as oxygen, water, ozone and/or nitrous oxide). Further, it may be desirable to remove cladding material 402 after oxidation is completed. Therefore, it should be possible to selectively remove the cladding material after oxidation without disturbing the suspended structure. By way of example only, silicon dioxide ($SiO_2$) could be used as a cladding material for thinning suspended Si nanowires. The $SiO_2$ cladding material could, for instance, be deposited around (i.e., so as to surround) micro/nanostructures 102 by a spin-on process or by chemical vapor deposition (CVD). By way of example only, in one embodiment, hydrogen silsequioxane (HSQ) is deposited around micro/nanostructures 102 using a spin-on process followed by a cure to convert the HSQ to $SiO_2$. The process and parameters for curing HSQ would be apparent to one of skill in the art and thus are not described further herein. In another exemplary embodiment, tetra-ethoxy-silane (TEOS) is deposited around micro/nanostructures 102 using CVD. The TEOS will hydrolyze into $SiO_2$ and ethanol. While not visible from the depiction in FIG. 4, cladding material 402 would, by way of a spin-on process or by CVD, be deposited over the entire structure 100 (see, for example, FIG. 1, described above), e.g., over pads 104/106, in addition to surrounding suspended micro/nanostructures 102.

A low-temperature oxide (LTO) may also be used as cladding material 402. The LTO may in some embodiment be deposited so as to surround the micro/nanostructures using a conformal deposition process, such as low-pressure chemical vapor deposition (LPCVD). As will be described in detail below, a conformal cladding material may be useful in instances where a material, e.g., a Si substrate below the suspended micro/nanostructures, is expected to oxidize during the process, expand and cause distortion of the micro/nanostructures. Use of a conformal cladding material permits a gap/space into which the oxidized substrate can expand. An alternative remedy is to use an oxidant-impermeable layer between the suspended micro/nanostructures and the substrate to prevent oxidation of the substrate altogether (see below).

Figure 5:
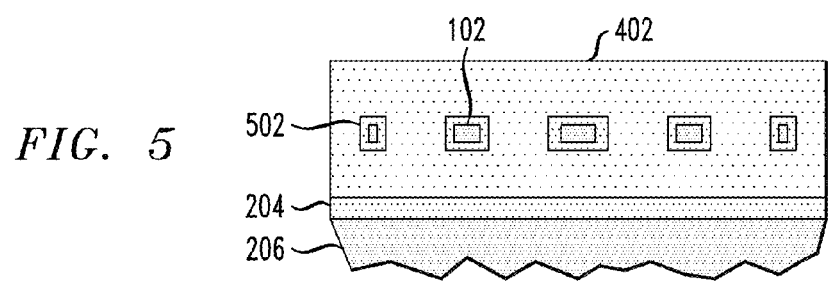
FIG. 5 is a cross-sectional diagram illustrating the micro/nanostructures of FIG. 4 having been oxidized through the cladding material according to an embodiment of the present invention.

Micro/nanostructures 102 are then oxidized by exposing them to an oxidant(s). Suitable oxidants for use herein include, but are not limited to oxygen, water, ozone and/or nitrous oxide. By way of example only, in the case of the oxidation of Si, the structure is heated to a temperature of from about 600 degrees Celsius (° C.) to about 1,350° C. in a gas containing at least one of the above-mentioned oxidants. Temperatures in the lower end of the range, e.g., from about 600° C. to about 1,100° C., will result in self-limiting oxidation. High stresses develop during a self-limiting oxidation process, and it is for these instances that the present techniques are most useful. The oxidation temperature is highly dependent on the actual material being oxidized, so other materials will require lower or higher temperatures. By keeping micro/nanostructures 102 from buckling as they oxidize (through the use of cladding material 402) amplification of buckling by oxidation is avoided. FIG. 5 is a cross-sectional diagram illustrating micro/nanostructures 102 having been oxidized through cladding material 402. FIG. 5 illustrates micro/nanostructures 102 post-oxidation, but prior to removal of cladding material 402. As shown in FIG. 5, oxide 502 is formed surrounding each of micro/nanostructures 102. It is notable that a portion of each of micro/nanostructures 102 is consumed by the oxidation thus resulting in micro/nanostructures 102 being reduced in size (see FIG. 5).

Prior to placing the cladding material and oxidizing the suspended micro/nanostructures, it may be desirable to symmetrize the micro/nanostructures. A pre-oxidation symmetrization improves control of the size and shape of the final structures. This symmetrization process is described in detail in U.S. application Ser. No. 12/417,936. In general, the symmetrization process involves a hydrogen annealing step to produce a reflow of Si along a circumference of the structures.

Specifically, as highlighted above, after lithography and etching, micro/nanostructures 102 can have varying width-to-thickness aspect ratios. To unify the aspect ratios (of width to thickness) of micro/nanostructures 102, an annealing process can be used to reflow the Si. However, it is preferable to first mask pads 104 and 106 (e.g., with a nitride mask, not shown) to prohibit the thermodynamically favored reflow of Si from micro/nanostructures 102 towards the pads (i.e., rather than the desired reflow of Si along a circumference of micro/nanostructures 102).

A hydrogen annealing step is then carried out, wherein the micro/nanostructures are contacted with hydrogen gas under conditions (see, e.g., temperature, pressure and duration processing conditions below) that produce a reflow of Si along a circumference of micro/nano structures 102. By way of the reflow, the aspect ratio of width to thickness is unified among all of micro/nanostructures 102. According to an exemplary embodiment, micro/nano structures 102 are heated to a temperature of from about 500° C. to about 1,300° C., e.g., from about 750° C. to about 950° C., in the presence of hydrogen gas (at a pressure of from about $1\times10^{-9}$ Torr to about $1\times10^{3}$ Torr, e.g., about $1\times10^{-2}$ Torr) for a duration of from about one second to about one day (24 hours), e.g., from about one second to about 10 hours. A similar symmetrization result can be obtained with long low-temperature anneals and short high-temperature anneals. The choice of process conditions will depend on the desired throughput and the tolerable process temperature for a given structure.

The hydrogen annealing enables surface diffusion of Si resulting in reflow of the micro/nanostructure Si causing micro/nanostructures 102 to take on a more cylindrical shape, thereby changing the aspect ratio. As a result, each of micro/nanostructures 102 will have a substantially uniform aspect ratio (e.g., an aspect ratio of about one, with a perfect cylinder having a width to thickness aspect ratio of one). See, for example, U.S. application Ser. No. 12/417,936. The required uniformity of the aspect ratio depends, at least in part, on the oxidation conditions used after symmetrization. However, even if the aspect ratio does not equal one and the micro/nanostructures are slightly asymmetric it is preferable that the aspect ratio does not differ from one by more than about 15 percent (%). According to an exemplary embodiment, this symmetrization procedure is performed after the step shown illustrated in FIG. 3 and prior to the step shown illustrated in FIG. 4. Incorporation of this symmetrization process into the present techniques is further described below by way of reference to an exemplary embodiment shown in FIGS. 11-14.

Figure 6:
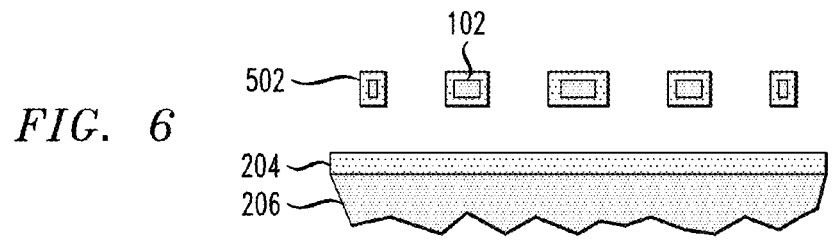
FIG. 6 is a cross-sectional diagram illustrating the cladding material having been removed according to an embodiment of the present invention.

Cladding material 402 may then be removed. This step is optional. FIG. 6 is a cross-sectional diagram illustrating cladding material 402 having been removed. The removal of cladding material 402 may be selective to oxide 502 (as in FIG. 6 wherein oxide 502 remains after cladding 402 has been removed), or oxide 502 may be removed along with cladding material 402 (not shown). By way of example only, when cladding material 402 is made up of $SiO_2$, it can be removed using a hydrofluoric acid (HF)-containing solution or vapor. In this example, the HF would also serve to remove oxide 502, resulting in thinned micro/nanostructures 102.

As highlighted above, it has been found by way of the present teachings that the bending or buckling of the suspended micro/nanostructures is due, at least in part, to various stresses at the Si-to-oxide interfaces of the micro/nanostructures which influence the speed of growth of the oxide. Unless the structures are constrained as described herein, any non-uniformities, such as curvature, in the structures are amplified during oxidation. This phenomenon is now described in further detail.

Figure 7:
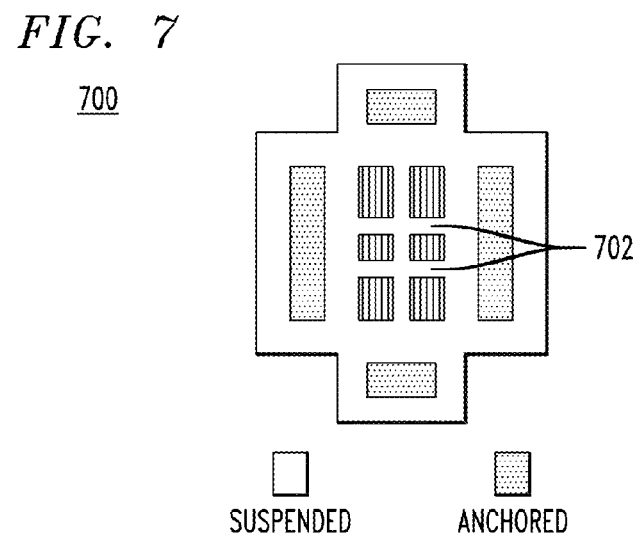
FIG. 7 is a top-down diagram illustrating a silicon-on-insulator (SOI) structure having suspended micro/nanostructures according to an embodiment of the present invention.
Figure 8:
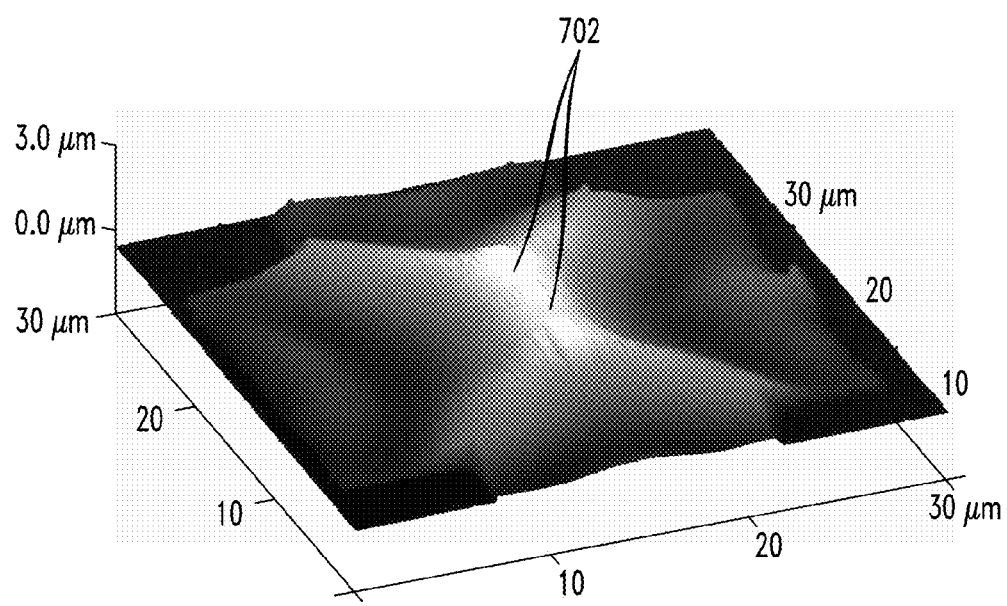
FIG. 8 is an atomic-force micrograph (AFM) image of the structure of FIG. 7 after oxidation is performed without constraining the suspended micro/nanostructures according to an embodiment of the present invention.

FIGS. 7 and 8 are diagrams illustrating why there is a need to constrain the suspended structures during oxidation, as according to the present teachings. Specifically, FIG. 7 is a top-down diagram illustrating a SOI structure 700 having suspended micro/nanostructures 702. Regions of the micro/nanostructures that are suspended are shown in white and regions of the structure that are anchored (these regions sit on the insulator (oxide) and are not suspended) are shown having a dotted pattern.

FIG. 8 is an atomic-force micrograph (AFM) image 800 of structure 700 (of FIG. 7) after oxidation is performed without constraining the suspended micro/nanostructures as described herein. As shown in image 800, very large buckling reaching 1.8 µm in height is observed (see, for example, the buckling observed in micro/nanostructures 702). Such buckling cannot be explained by elastic deformation.

Figure 9A:
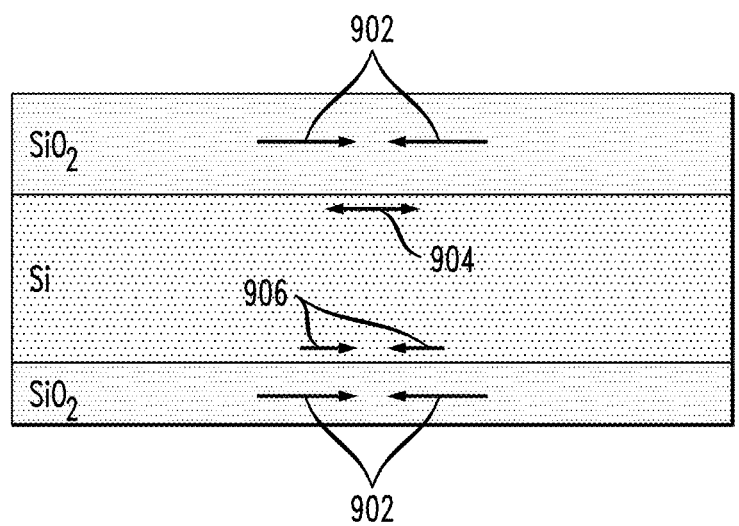
FIG. 9A is a cross-sectional diagram illustrating the stresses occurring at silicon (Si)-to-oxide interfaces according to an embodiment of the present invention.
Figure 9B:
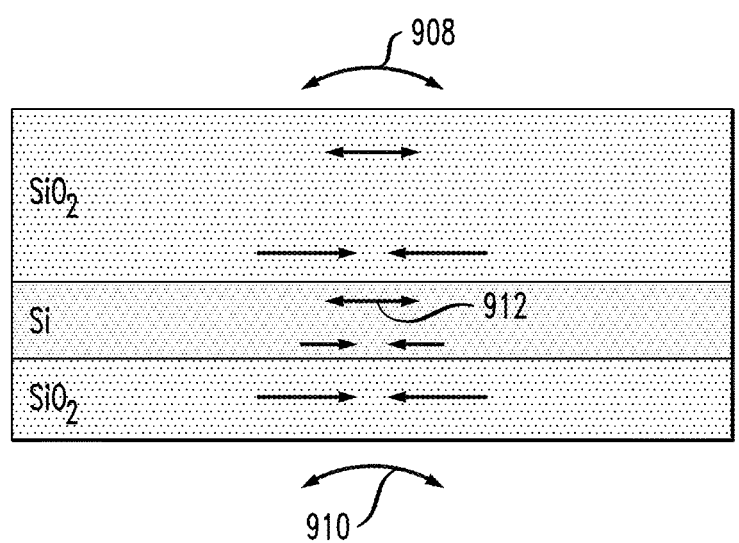
FIG. 9B is a cross-sectional diagram illustrating how the stresses cause bending/buckling as oxidation progresses according to an embodiment of the present invention.

What is happening is an amplification of curvature by preferential growth on tensile stressed interfaces. This effect is illustrated in FIGS. 9A and 9B. Specifically, FIG. 9A is a cross-sectional diagram illustrating, by way of arrows 902 and 904/906, respectively, the stresses occurring in the oxide (labeled "$SiO_2$") and Si at these interfaces. Arrows 902 and 906 indicate compressive stress and arrow 904 indicates tensile stress. FIG. 9B is a cross-sectional diagram illustrating how the stresses result in bending/buckling, by way of arrows 908 and 910, as the oxidation progresses. As shown in FIG. 9B, since the oxide at the top of the structure was initially slightly thicker (see, FIG. 9A), the oxide introduced a tensile stress in the Si at the top Si interface. This tensile stress results in preferential oxide growth on the top of the structure undesirably making the oxide on the top substantially thicker than the oxide on the bottom (see FIG. 9B). This preferential oxide growth results in buckling of the suspended structure and tensile stress in the top region of the Si, as indicated by arrow 912.

Stress at the Si-to-oxide interface is key for influencing the speed of oxide growth. An interface in tensile stress will grow faster than one in compressive stress. If there is a slight initial curvature in the sample or if (as here) there is a slight imbalance in the oxide thickness there will be a corresponding imbalance in interface stress and hence in oxidation speed. This mechanism will amplify the existing imbalance and can result in dramatic curvature amplification. As shown in FIG. 9B, the Si is consumed during the oxidation process.

Figure 10:
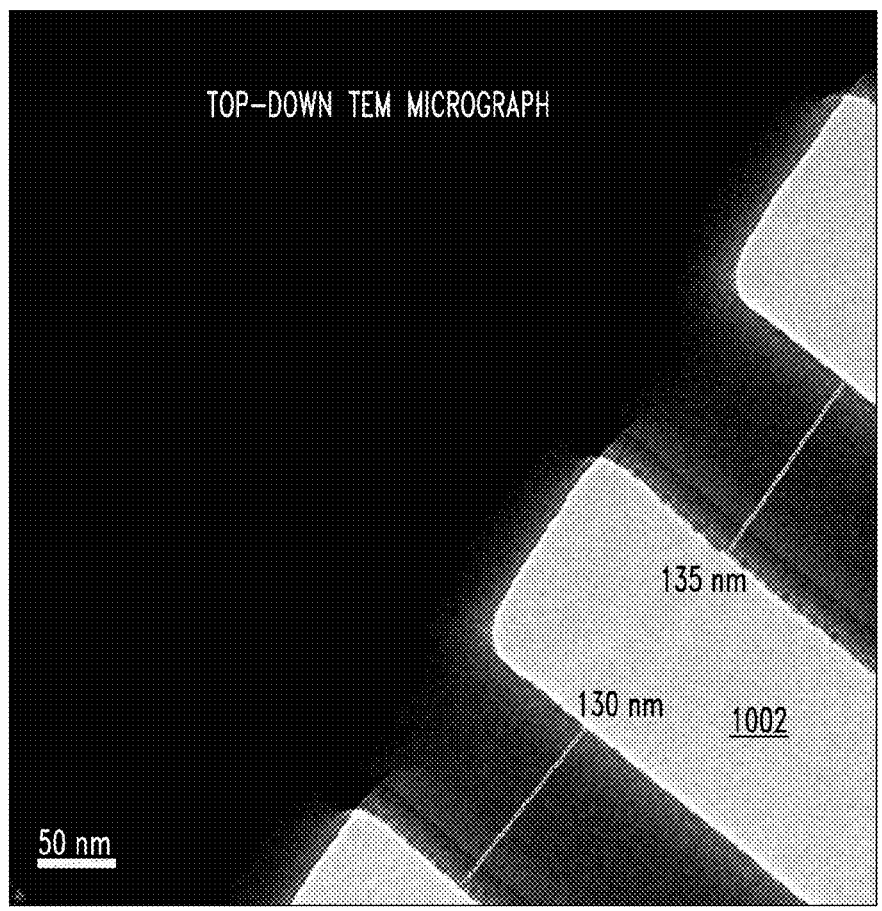
FIG. 10 is a top-down transmission electron micrograph (TEM) image of suspended Si micro/nanostructures subjected to self-limiting oxidation without constraining the suspended micro/nanostructures as described herein according to an embodiment of the present invention.

In the case of stress-limited oxidations such as self-limiting oxidation of Si micro/nanostructures (see above), the speed of the thinning can also be significantly accelerated by this interface stress effect, see FIG. 10. FIG. 10 is a top-down transmission electron micrograph (TEM) image 1000 of suspended Si micro/nanostructures 1002 subjected to self-limiting oxidation without constraining the suspended micro/nanostructures as described herein. A Si core was expected but the structures very completely oxidized instead.

FIGS. 11-14 are cross-sectional diagrams illustrating an exemplary methodology for oxidizing one or more suspended elements (e.g., one or more suspended microstructures and/or nanostructures) that incorporates a symmetrization procedure into the process described, for example, in conjunction with the description of FIG. 1-6, above. This methodology is also referred to herein as a two-step thinning process because the suspended micro/nanostructures are symmetrized in a first step and oxidized in a second step of the thinning process (see description below).

Figure 11:
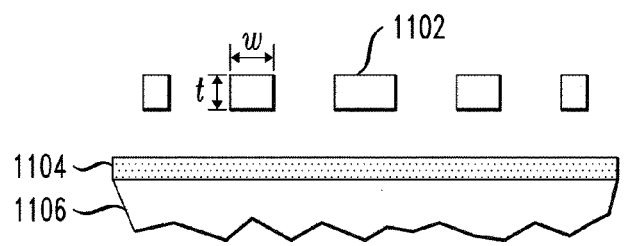
FIG. 11 is a cross-sectional diagram illustrating one or more suspended micro/nanostructures according to an embodiment of the present invention.

The process begins with one or more suspended micro/nanostructures. FIG. 11 is a cross-sectional diagram illustrating one or more suspended micro/nanostructures 1102. For the purposes of the present description, it is not important how the suspended micro/nanostructures are fabricated. However, for a point of reference, suspended micro/nano structures 1102 may be fabricated using the process described, for example, in conjunction with the description of FIGS. 1-3, above. In fact, in some embodiments, the structure in FIG. 11 is the same as the structure in FIG. 3 and thus represents for example a cross-sectional cut through line A1-A2 of FIG. 1 (described above). Accordingly, in that example, micro/nanostructures 1102 are suspended by undercutting a BOX 1104 that is present over a substrate 1106.

Figure 12:
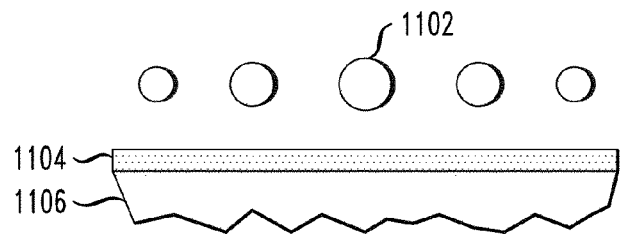
FIG. 12 is a cross-sectional diagram illustrating a symmetrization process having been performed on the micro/nanostructures of FIG. 11 according to an embodiment of the present invention.
Figure 13:
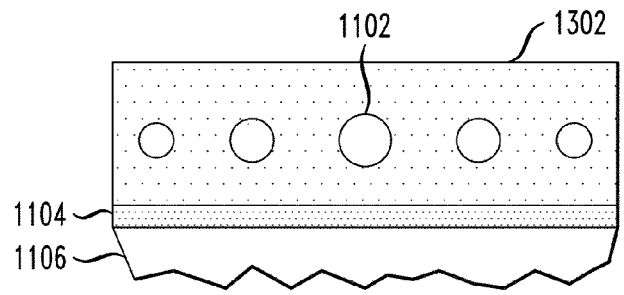
FIG. 13 is a cross-sectional diagram illustrating the micro/nanostructures of FIG. 12 having been surrounded in a cladding material according to an embodiment of the present invention.

As shown in FIG. 11, after lithography and etching, micro/nanostructures 1102 can have varying width w to thickness t aspect ratios. Thus, a symmetrization process using hydrogen annealing, as set forth above and in U.S. application Ser. No. 12/417,936 may be used to unify the aspect ratios of micro/nanostructures 1102. FIG. 12 is a cross-sectional diagram illustrating micro/nanostructures 1102 after the symmetrization process described herein has been performed thereon. As shown in FIG. 12, micro/nanostructures 1102 all have a substantially uniform aspect ratio. The micro/nanostructures are then surrounded in a cladding material. FIG. 13, for example, is a cross-sectional diagram illustrating micro/nanostructures 1102 having been surrounded in a cladding material 1302. Suitable cladding materials and techniques for the deposition thereof were described in detail, for example, in conjunction with the description of FIG. 4, above. It is notable that since cladding material 1302 will remain in place during the oxidation (i.e., the micro/nanostructures are oxidized through the cladding material), the cladding needs to be permeable to at least one oxidant.

Figure 14:
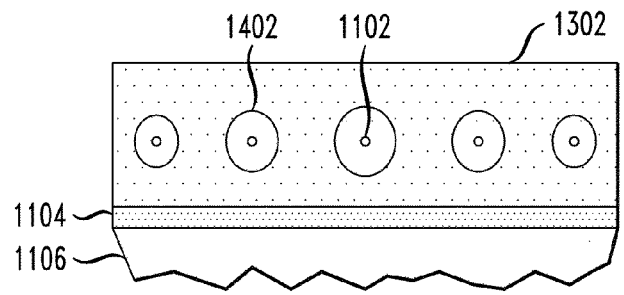
FIG. 14 is a cross-sectional diagram illustrating the micro/nanostructures of FIG. 13 having been oxidized through the cladding material according to an embodiment of the present invention.

The micro/nanostructures are then oxidized through the cladding material. FIG. 14, for example, is a cross-sectional diagram illustrating micro/nanostructures 1102 having been oxidized by exposing micro/nanostructures 1102 to at least one oxidant through cladding material 1302. Suitable oxidants and techniques for introducing the oxidant(s) to the micro/nanostructures through the cladding material were described in detail above. As a result, oxide 1402 is formed surrounding each of micro/nanostructures 1102. A portion of each of micro/nanostructures 1102 is consumed by the oxidation thus resulting in micro/nanostructures 1102 being reduced in size (see FIG. 14). As described above, cladding material 1302 can be removed, if desired (not shown). The process used to remove cladding material 1302 can optionally be configured to, at the same time, remove oxide 1402 thereby thinning micro/nanostructures 1102. This process was described above.

Figure 15:
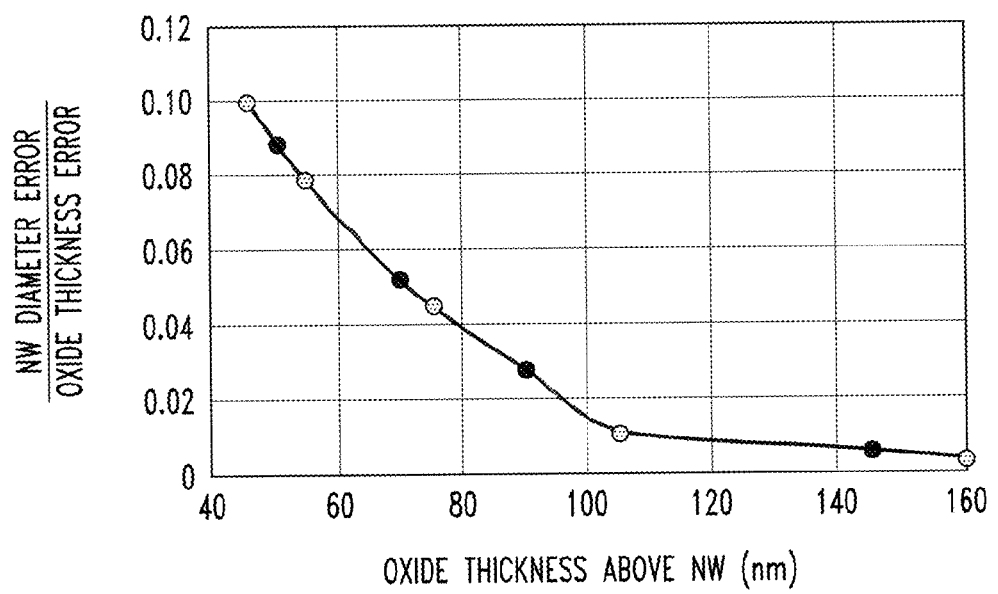
FIG. 15 is a graph illustrating the impact of cladding thickness error on a self-limiting oxidation process according to an embodiment of the present invention.

Variations in the thickness of the cladding material deposited on the micro/nanostructures can impact the oxidation rate of the suspended micro/nanostructures. However, the impact of cladding thickness non-uniformity and differences between expected and deposited average cladding thickness can be made negligible if the cladding is sufficiently thick. See, for example, FIG. 15. FIG. 15 is a graph 1500 illustrating the impact of cladding thickness error on a self-limiting oxidation process (also referred to as a "self-limiting thinning process"). Graph 1500 was obtained from finite element simulations of the oxidation process. In this instance, the cladding material used is an oxide material, such as $SiO_2$, and is thus referred to herein generically as "oxide." Thus, specifically in graph 1500 oxide (cladding) thickness above the nanostructure, in this case a nanowire (NW) (measured in nm) is plotted as a function of a ratio of nanowire diameter error to oxide (cladding) thickness error. The results in graph 1500 show that cladding material thickness errors are a negligible source of error on the resulting nanostructure, i.e., nanowire, diameter if the cladding material has a thickness above the nanostructure of greater than about 100 nm. In particular, FIG. 15 shows that an increase in the cladding thickness above the nanowires from 100 nm to 110 nm would result in the nanowire diameter after thinning being only 0.2 nm larger. This result illustrates that cladding thickness errors can have a negligible impact on oxidation rate. Further experimentation has verified that the presence of the cladding material has no effect on the self-limiting oxidation process.

It is notable that if a material below the suspended micro/nanostructures is expected to substantially oxidize during the oxidation of the suspended micro/nanostructures, it may be desirable to add a material that is impermeable to the oxidant(s) in between the suspended structures and the material expected to oxidize (i.e., the oxidizable material below the suspended micro/nanostructures). This is because the volume expansion related to substantial oxidation of a material below the suspended micro/nanostructures can push the suspended micro/nanostructures (which are buried in a cladding, as described above) up and create buckling. It is notable that any material can have negligible oxidation but only 'substantial' oxidation will be a problem. The term 'substantial oxidation' as used herein refers to oxidation that is significant enough to substantially stress the suspended micro/nanostructures upwards. The push upwards comes from volume expansion of the substrate material oxidizing, as described above.

Take as an example an SOI structure having a SOI layer separated from a Si substrate by a BOX where the SOI layer is suspended by partial or complete removal of the BOX. A cladding is then deposited as described above. Oxidation of the SOI structures buried in the cladding may result in oxidation of the bulk Si below the SOI structure. The volume expansion from the bulk Si oxidation may result in upward buckling of the SOI structure.

Figure 16:
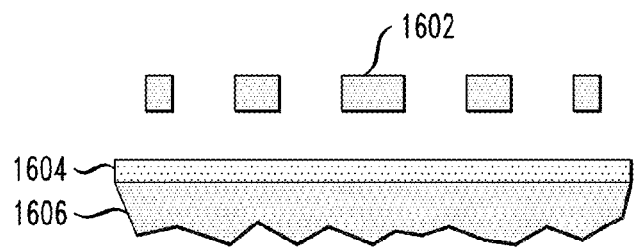
FIG. 16 is a cross-sectional diagram illustrating one or more micro/nanostructures suspended over a substrate according to an embodiment of the present invention.

FIGS. 16-19 are cross-sectional diagrams illustrating an exemplary methodology for preventing oxidation of a material below suspended micro/nanostructures using a material impermeable to the oxidant(s). The process begins with one or more suspended elements (e.g., one or more suspended microstructures and/or nanostructures). FIG. 16 is a cross-sectional diagram illustrating one or more suspended microstructures and/or nanostructures 1602. For the purposes of the present description, it is not important how the suspended micro/nanostructures are fabricated. However, for a point of reference, suspended micro/nanostructures 1602 may be fabricated using the process described, for example, in conjunction with the description of FIGS. 1-3, above. In fact, in some embodiments, the structure in FIG. 16 is the same as the structure in FIG. 3 and thus represents for example a cross-sectional cut through line A1-A2 of FIG. 1 (described above). Accordingly, in that example, micro/nanostructures 1602 are suspended by undercutting a BOX 1604 that is present over a substrate 1606. Further, in this example, substrate 1606 is made up of a material that is expected to substantially oxidize during the oxidation of the suspended micro/nanostructures, such as Si.

Figure 17:
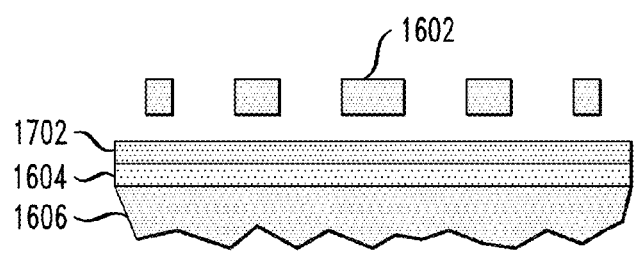
FIG. 17 is a cross-sectional diagram illustrating an oxidant-impermeable layer having been deposited over the substrate according to an embodiment of the present invention.

To prevent oxidation of substrate 1606 during oxidation of micro/nanostructures 1602 (thus preventing any potential buckling, as described above), a material that is impermeable to the oxidant(s) employed is deposited between the substrate and the structures to be oxidized, i.e., the micro/nanostructures. Thus, in this manner, oxidation will be limited to the micro/nanostructures. FIG. 17 is a cross-sectional diagram illustrating an oxidant-impermeable layer 1702 having been deposited over substrate 1606. It is notable that even if the BOX is only partially removed from beneath the micro/nanostructures as in FIG. 17 (i.e., even though undercut, a portion of the BOX remains over the substrate), oxidation of the substrate can still occur and thus it is desirable to use an oxidant-impermeable layer. According to an exemplary embodiment, oxidant-impermeable layer 1702 is made up of a silicon nitride layer having a thickness of from about three nm to about 300 nm. The silicon nitride can be deposited using, for instance, LPCVD prior to surrounding the micro/nanostructures in the cladding material.

Figure 18:
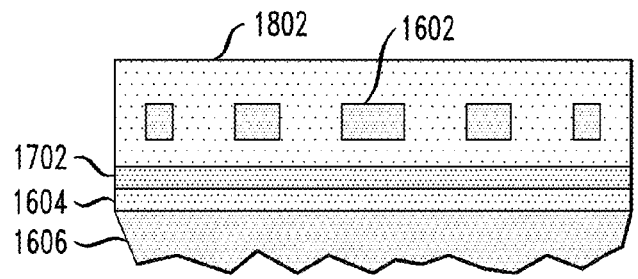
FIG. 18 is a cross-sectional diagram illustrating the micro/nanostructures of FIG. 17 having been surrounded in a cladding material according to an embodiment of the present invention.

The micro/nanostructures are then surrounded in a cladding material. FIG. 18 is a cross-sectional diagram illustrating micro/nanostructures 1602 having been surrounded in a cladding material 1802. Suitable cladding materials and techniques for the deposition thereof were described in detail, for example, in conjunction with the description of FIG. 4, above. It is notable that since cladding material 1802 will remain in place during the oxidation (i.e., the micro/nanostructures are oxidized through the cladding material), the cladding material needs to be permeable to at least one oxidant. Oxidant-impermeable layer 1702 will, however, prevent oxidation of the substrate beneath it.

Figure 19:
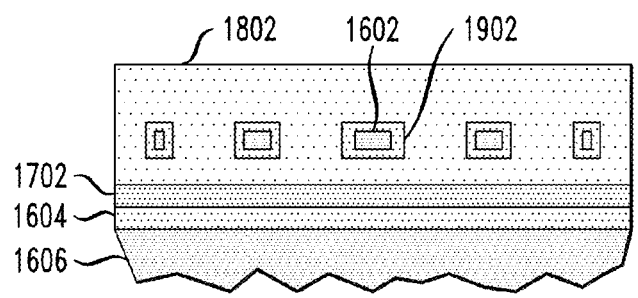
FIG. 19 is a cross-sectional diagram illustrating the micro/nanostructures of FIG. 18 having been oxidized through the cladding material according to an embodiment of the present invention.

The micro/nanostructures are then oxidized through the cladding material. FIG. 19, for example, is a diagram illustrating micro/nanostructures 1602 having been oxidized by exposing micro/nano structures 1602 to at least one oxidant through cladding material 1802. Suitable oxidants and techniques for introducing the oxidants to the micro/nanostructures through the cladding material were described in detail above. As a result, oxide 1902 is formed surrounding each of micro/nanostructures 1602. A portion of each of micro/nanostructures 1602 is consumed by the oxidation thus resulting in micro/nanostructures 1602 being reduced in size (see FIG. 19). As described above, cladding material 1802 can be removed, if desired (not shown). The process used to remove cladding material 1802 can optionally be configured to, at the same time, remove oxide 1902 thereby thinning micro/nanostructures 1602. This process was described above.

The techniques described in conjunction with the description of FIGS. 16-19 may be combined with any of the other techniques described herein. By way of example only, the use of an oxidant-impermeable layer may be combined with the symmetrization process described above (e.g., an oxidant-impermeable layer may be deposited before or after symmetrization, but before cladding deposition and oxidation).

The problem of an expanding material below the suspended micro/nanostructures can also be dealt with by using substantially conformal deposition of the cladding material. Such an approach allows for leaving a gap below the suspended structure(s) to allow expansion of the bottom material (e.g., the oxidizable substrate) without inducing upward buckling in the suspended structure(s). Further, the added rigidity to the suspended micro/nanostructures induced by the conformally deposited cladding material will substantially reduce buckling of the suspended micro/nanostructures at oxidation.

Figure 20:
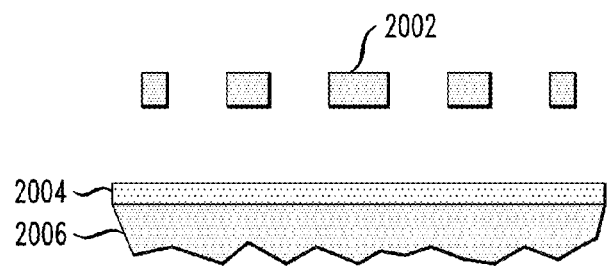
FIG. 20 is a cross-sectional diagram illustrating one or more micro/nanostructures suspended over a substrate according to an embodiment of the present invention.

FIGS. 20-23 are cross-sectional diagrams illustrating an exemplary methodology for preventing oxidation of a material below suspended micro/nanostructures from affecting (i.e., distorting) the suspended micro/nanostructures by leaving a space for the material to expand upon oxidation. The process begins with one or more suspended elements (e.g., one or more suspended micro/nanostructures). FIG. 20 is a cross-sectional diagram illustrating one or more suspended microstructures and/or nanostructures 2002. For the purposes of the present description, it is not important how the suspended micro/nanostructures are fabricated. However, for a point of reference, suspended micro/nanostructures 2002 may be fabricated using the process described, for example, in conjunction with the description of FIGS. 1-3, above. In fact, in some embodiments, the structure in FIG. 20 is the same as the structure in FIG. 3 and thus depicts for example a cross-sectional cut through line A1-A2 of FIG. 1 (described above). Accordingly, in that example, micro/nanostructures 2002 are suspended by undercutting a BOX 2004 that is present over a substrate 2006. Further, in this example, substrate 2006 is made up of a material that is expected to substantially oxidize during the oxidation of the suspended micro/nanostructures, such as Si.

Figure 21:
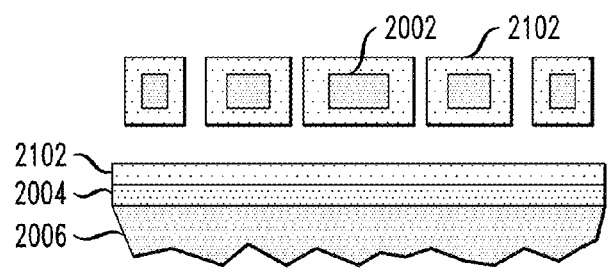
FIG. 21 is the first of two cross-sectional diagrams illustrating a progression of a conformal deposition of a cladding material around the micro/nanostructures of FIG. 20 and over the substrate according to an embodiment of the present invention.

In this example, it is assumed that substrate 2006 will oxidize (and thereby expand) during the oxidation of micro/nanostructures 2002. To prevent the expanding oxidized substrate from pressing on and causing upward buckling of the micro/nanostructures, a conformal cladding material is used that will provide space by way of a gap, between the cladding material on the micro/nanostructures and the cladding material on the substrate into which the substrate can expand. To best illustrate formation of the conformal cladding material, the deposition process is shown illustrated in two separate figures, FIGS. 21 and 22, which show a progression of the deposition process. FIG. 21 is a cross-sectional diagram illustrating the deposition process after a portion of a conformal cladding material 2102 has been deposited around (i.e., so as to surround) micro/nanostructures 2002 and on BOX 2004 (over substrate 2006). As described above, in this example, the BOX may be partially or fully removed (undercut) from beneath the micro/nanostructures. Even if the BOX is only partially removed as in FIG. 21, oxidation of the substrate can still occur and thus it is desirable to take measures to prevent the oxidizing substrate from distorting the suspended structures. According to an exemplary embodiment, conformal cladding material 2102 is a LTO (which is permeable to the oxidants employed herein) that is conformally deposited using LPCVD.

Figure 22:
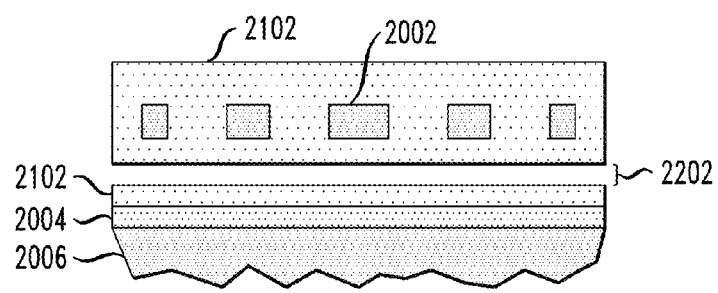
FIG. 22 is the second of two cross-sectional diagrams illustrating a progression of a conformal deposition of a cladding material around the micro/nanostructures of FIG. 20 and over the substrate according to an embodiment of the present invention.

FIG. 22 is a cross-sectional diagram illustrating the deposition process at completion after all of the conformal cladding material 2102 has been deposited around (i.e., so as to surround) micro/nanostructures 2002 and on BOX 2004 (over substrate 2006). As shown in FIG. 22, a gap 2202 is left between the conformal cladding material surrounding the micro/nanostructures and the conformal cladding material over the substrate. This gap will accommodate expansion of the substrate during oxidation.

Figure 23:
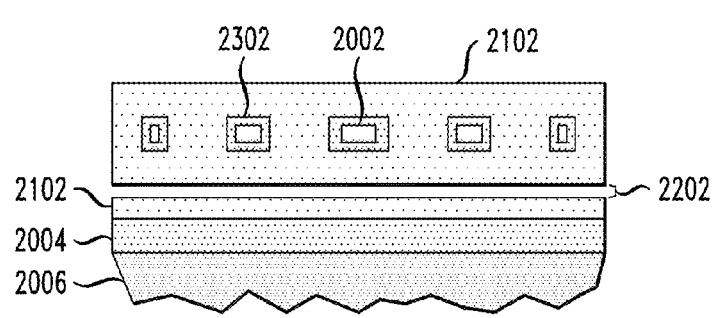
FIG. 23 is a cross-sectional diagram illustrating the micro/nanostructures of FIG. 22 having been oxidized through the cladding material according to an embodiment of the present invention.

The micro/nanostructures are then oxidized through the cladding material. FIG. 23, for example, is a cross-sectional diagram illustrating micro/nanostructures 2002 having been oxidized by exposing micro/nanostructures 2002 to at least one oxidant through cladding material 2102. Suitable oxidants and techniques for introducing the oxidant(s) to the micro/nanostructures through the cladding material were described in detail above. As a result, oxide 2302 is formed surrounding each of micro/nanostructures 2002. A portion of each of micro/nanostructures 2002 is consumed by the oxidation thus resulting in micro/nanostructures 2002 being reduced in size (see FIG. 23). It is notable that substrate 2006 has also been oxidized in this process as indicated by the increased thickness of BOX 2004 post oxidation. This oxidation has closed gap 2202, however not enough that the cladding material over the substrate contacts the cladding material surrounding the micro/nanostructures. Thus, without the gap, the expanding oxide from the substrate could displace and thus distort the micro/nanostructures.

As described above, cladding material 2102 can be removed, if desired (not shown). The process used to remove cladding material 2102 can optionally be configured to, at the same time, remove oxide 2302 thereby thinning micro/nanostructures 2002. This process was described above.

The techniques described in conjunction with the description of FIGS. 20-23 may be combined with any of the other techniques described herein. By way of example only, the use of a conformally deposited cladding material so as to provide an oxidation expansion compensating gap may be combined with the symmetrization process described above (e.g., cladding material may be conformally deposited around (i.e., so as to surround) symmetrized micro/nanostructures).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for oxidizing a structure, the method comprising:
    providing the structure having at least one suspended element selected from the group consisting of: a microstructure, a nanostructure and a combination thereof suspended over an oxidizable material;
    conformally depositing a cladding material on the oxidizable material and around the at least one suspended element using a spin-on process or chemical vapor deposition so as to provide a gap between the cladding material on the oxidizable material and the cladding material that surrounds the at least one suspended element, wherein the cladding material employed is permeable to at least one oxidant; and
    oxidizing the at least one suspended element through the cladding material,
    wherein the cladding material physically constrains and thereby prevents distortion of the at least one suspended element during the oxidation.

2. The method of claim 1, wherein the at least one suspended element is suspended over an oxidizable material, the method further comprising:
    depositing an oxidant-impermeable layer between the at least one suspended element and the oxidizable material to prevent oxidation of the oxidizable material.

3. The method of claim 2, wherein the oxidant-impermeable layer comprises silicon nitride.

4. The method of claim 1, further comprising:
    providing a silicon-on-insulator (SOI) wafer having a SOI layer separated from a substrate by a buried oxide (BOX) layer;
    forming a ladder-like structure in the SOI layer comprising pads attached at opposite ends of at least one element; and
    suspending the at least one element by removing the BOX from thereunder to form the at least one suspended element.

5. The method of claim 4, wherein the substrate comprises the oxidizable material, the method further comprising:
    conformally depositing the cladding material on the substrate and around the at least one suspended element so as to provide a gap between the cladding material on the substrate and the cladding material around the at least one suspended element.

6. The method of claim 1, wherein the oxidizing further comprises:
    forming an oxide on the at least one suspended element.

7. The method of claim 6, further comprising:
    removing the oxide from the at least one suspended element.

8. The method of claim 1, wherein the at least one suspended element comprises at least one microstructure in the form of a microwire having a width of from about one micrometer to about 100 micrometers, and a thickness of from about 0.1 micrometers to about 20 micrometers.

9. The method of claim 1, wherein the at least one suspended element comprises at least one nanostructure in the form of a nanowire having a width of from about one nanometer to about 1,000 nanometers, and a thickness of from about 0.1 nanometers to about 100 nanometers.

10. The method of claim 1, further comprising:
    removing the cladding material after the oxidizing has been performed.

11. The method of claim 10, wherein the cladding material comprises silicon dioxide, and wherein the cladding material is removed using hydrofluoric acid.

12. The method of claim 1, further comprising:
    depositing hydrogen silsesquioxane around the at least one suspended element using a spin-on process; and
    curing the hydrogen silsesquioxane to convert the hydrogen silsesquioxane to silicon dioxide which serves as the cladding material.

13. The method of claim 1, further comprising:
    depositing tetra-ethoxy-silane around the at least one suspended element using chemical vapor deposition, wherein the tetra-ethoxy-silane hydrolyzes into silicon dioxide, which serves as the cladding material, and ethanol.

14. The method of claim 1, further comprising:
symmetrizing the at least one suspended element prior to performing the surrounding step.

15. The method of claim 1, wherein the oxidizing further comprises:
heating the structure to a temperature of from about 600 degrees Celsius to about 1,350 degrees Celsius in a gas containing at least one oxidant.

16. The method of claim 15, wherein the at least one oxidant comprises one or more of oxygen, water, ozone and nitrous oxide.

* * * * *